United States Patent [19]
Hunter

[11] Patent Number: 5,972,109
[45] Date of Patent: Oct. 26, 1999

[54] GROWTH OF BULK SINGLE CRYSTALS OF ALUMINUM NITRIDE

[76] Inventor: Charles Eric Hunter, 24 Shell Ring Rd., Hilton Head Island, S.C. 29928

[21] Appl. No.: 09/111,412

[22] Filed: Jul. 7, 1998

Related U.S. Application Data

[62] Division of application No. 08/730,882, Oct. 17, 1996, Pat. No. 5,858,086.

[51] Int. Cl.[6] .................................................... C30B 35/00
[52] U.S. Cl. ............................ 117/204; 117/200; 117/900
[58] Field of Search .................................. 117/84, 87, 88, 117/200, 204, 900

*Primary Examiner*—Felisa Garrett
*Attorney, Agent, or Firm*—Richard S. Faust

[57] ABSTRACT

Bulk, low impurity aluminum nitride (AlN) single crystals are grown by sublimation or similar deposition techniques at growth rates greater than 0.5 mm/hr.

21 Claims, 11 Drawing Sheets

Thermal Sink

252

Nonuniform Thermal Profile

Thermal Sink

Heating Element

Uniform Thermal Profile

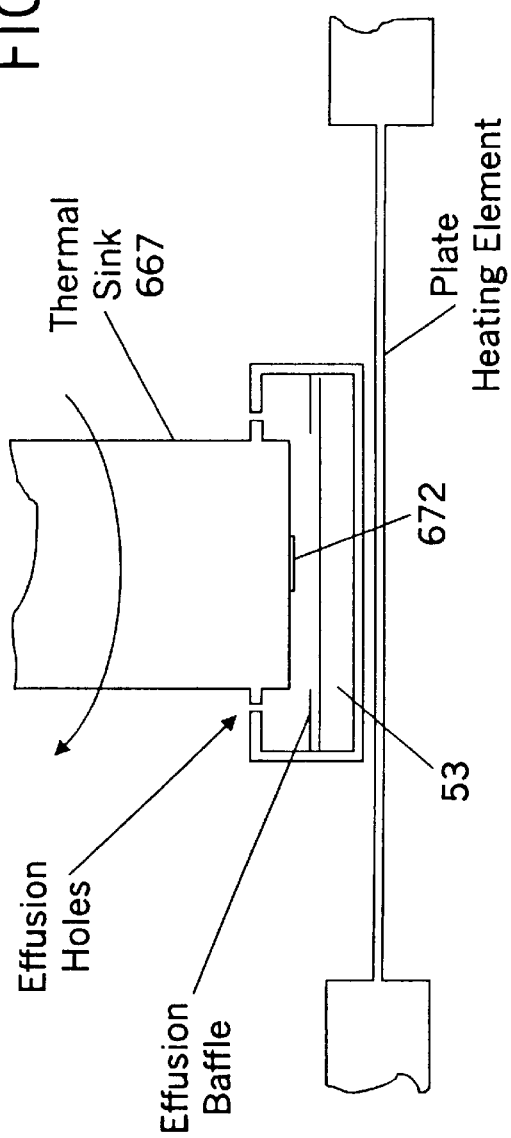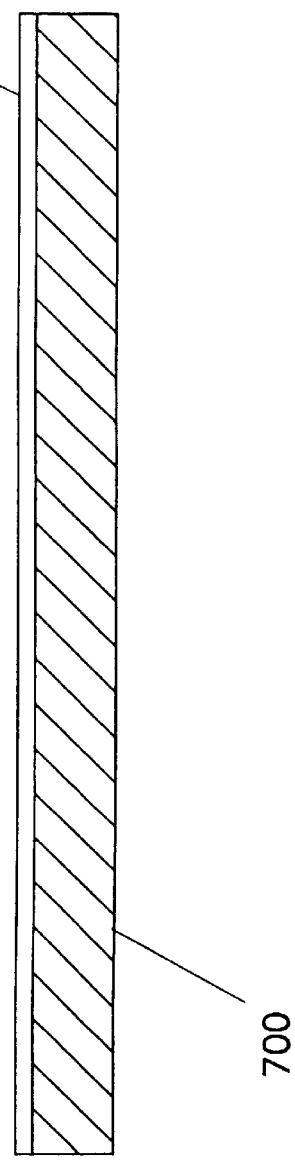

GROWTH OF BULK SINGLE CRYSTALS OF ALUMINUM NITRIDE

This is a division of application Ser. No. 08/730,882, filed Oct. 17, 1996 now U.S. Pat. No. 5,858,086.

FIELD OF THE INVENTION

The invention relates to the growth of semiconductor materials. More particularly, the invention relates to the growth of bulk single crystals of aluminum nitride.

BACKGROUND OF THE INVENTION

The physical and electronic properties of aluminum nitride (AlN) give it great potential for a wide variety of semiconductor applications. AlN has a wide energy bandgap (6.2 electron volts), high breakdown electric field and extremely high thermal conductivity. In fact, in Chow et. al *Wide Bandgap Compound Semiconductors for Superior High Voltage Unipolar Power Devices* (IEEE Transactions on Electron Devices, Vol. 41, No. 8, 1994) ranking all semiconductors materials, AlN is reported to have, excluding diamond, the highest figure of merit for unipolar power device performance.

In addition, the high thermal conductivity and high optical transmissivity (i.e., low optical density) of AlN make AlN an excellent candidate substrate material. Also, AlN is likely to be the optimum substrate for the growth of pseudo-binary inter metallic compounds such as $Al_{0.8}In_{0.2}N$ which have extremely high figures of merit for semiconductor performance (up to 4,413,000 times silicon). Although AlN has extraordinary properties for a semiconductor material and has tremendous commercial potential, AlN based semiconductor devices have been limited by the unavailability of large, low defect AlN single crystals. In the most successful prior work, Slack and McNelly demonstrated a method for growing AlN single crystals via sublimation in *AlN Single Crystals* (Journal of Crystal Growth 42, 1977). However, the time required to grow a 12 mm by 4 mm crystal was approximately 150 hours. This growth rate is far too low to ever allow the commercial production of AlN single crystals.

SUMMARY OF THE INVENTION

The present invention enables one to grow bulk, low impurity AlN single crystals at growth rates greater than 0.5 mm per hour. The invention in its most basic form is a method for allowing a high flux of vaporized AlN to deposit in an isotropic manner on a growing crystal interface without interference caused by significant impurity atoms, impurity molecules or accumulated non-stoichiometric vapor constituents being present at the growing crystal interface.

One feature of the invention is a unique effusion system that is utilized to sweep impurity atoms/molecules and non-stoichiometric vapor constituents in the vapor away from the growing crystal interface. As shown by Abernathy in *Congruent Vapor Transport* (Journal of Crystal Growth 47, 1979) impurity atom or impurity molecule build up at a growing crystal interface dramatically reduces the crystal growth rate. Also, it has been found that inconsistencies between the stoichiometry of the vapor at the source and the stoichiometry of the vapor required for optimum growth conditions at the growing crystal interface can result in the accumulation of non-stoichiometric vapor constituents at the growing crystal interface. In one embodiment of the invention, a novel effusion system utilizes a series of effusion holes in fluid communication with a master effusion outlet to provide effusion directly at the growing crystal interface as the crystal grows. Preferably, the total effusion rate is maintained at or near a predetermined percentage (e.g. 30%) of the total vapor flow rate ($N_c$=30% of $N_t$). Other embodiments of the effusion system are disclosed. These systems are designed to provide optimum impurity effusion at the growing crystal interface, preferably at a constant rate throughout the crystal growth run. This constant effusion system significantly increases the AlN crystal growth rate by sweeping away matter that blocks deposition of the desired vapor species and substantially decreases impurity levels in the grown crystal.

Another feature of the invention is a growth system that provides a significant decrease in the ratio of crucible height to diameter (H:D aspect ratio) while maintaining a uniform thermal profile across the growing crystal interface. In this regard, Slack and McNelly, supra, used a radio frequency heating apparatus which provided a relatively compact system, but would not allow the use of a crucible having a low ratio of height to diameter without creating a highly non uniform thermal gradient. By decreasing the crucible height to diameter ratio, several important advantages may be achieved. First, the viscous interaction of the source vapor with the walls of the crucible is dramatically reduced, resulting in improved fluid dynamics characteristics within the crucible, i.e., vastly improved mass transport. Second, the low H:D aspect ratio enables the growth system to operate with a significantly lower absolute temperature difference between the source and the growing crystal interface, while maintaining an optimum thermal gradient between the source and the growing crystal interface. This lower temperature difference means that the stoichiometry of the vapor at the growing crystal interface (i.e., the stoichiometry required for optimum crystal growth) may be relatively close to the stoichiometry of the vapor at the source, resulting in less accumulated non-stoichiometric vapor constituents at the growing crystal interface. As mentioned above, this desirable condition permits vastly improved growth rates, while also permitting the growth of exceptionally large diameter AlN single crystals (e.g. 2 inch diameter).

In certain preferred embodiments of the invention a flat heated plate or parallel flat heated plates are used instead of a typical cylindrical heating arrangement. These flat plate designs, which preferably are carried out by resistance heating, provide a highly uniform thermal profile at the growing crystal interface and a steep thermal gradient to allow the growth of very large diameter AlN and AlN alloy single crystals at relatively high growth rates, and are adapted to be used in conjunction with effusion systems as discussed above.

The constant flux of source vapor may be provided in a number of ways, for example, from an AlN crystal or crystals, sintered AlN, hydrostatically pressed AlN, AlN powder or other solid form containing AlN, Al or N. Other embodiments of the invention utilize gas injection to provide a constant flux of source vapor. The source gas may take the form of $AlCl_3$, $NH_3$, vaporized Al, $N_2$, atomic nitrogen, nitrogen ions, $N_2$ in combination with nitrogen ions, $N_2$ that has been excited via microwave, laser or other energy source, or other gases that contain nitrogen or aluminum, alone or in combination. Furthermore, source vapor may be provided in part from solid or liquid source material and in part from a gas source material, for example, the use of source vapor from molten Al combined with $N_2$.

The gas injector system can also be used to increase the effective effusion by providing a flow of effusion-assist gas such as $N_2$ or argon. The use of an effusion-assist gas increases the flow rate of gas past the growing crystal interface by adding additional flow to the source vapor flow.

The growth system may also utilize an injected gas that serves as both a source gas and an effusion-assist gas, for example, by injection of $N_2$ or ammonia ($NH_3$). In this regard, the cracking of ammonia provides nitrogen to react with Al atoms located on the surface of the growing AlN crystal to form AlN The bulk crystals of the present invention may be grown with sufficient size for commercial application, particularly for the electronics industry. While any useful size crystal may be grown according to the invention, in most applications the crystals will have a diameter of two to three inches and above.

The bulk single crystals of the invention are typically grown as intrinsic AlN, doped AlN, or AlN alloys and compounds containing significant amounts of AlN, for example, greater than 50% AlN.

Because the resistance heated, constant effusion crystal growth systems of preferred embodiments of the invention allow very high growth rates and shorter run times, slightly lower growth temperatures can be utilized. While graphite crucibles are primarily used in examples discussed in this specification, this lower temperature allows the use of tungsten as the crucible and effusion baffle material, which would permit greater control over AlN crystal impurity levels.

In one aspect the present invention maybe defined as a method of producing bulk single crystals of AlN at enhanced growth rates comprising growing AlN by depositing vapor species containing Al and N on the growth surface of a seed crystal while providing effusion of the growing crystal interface sufficient to grow AlN in single crystalline form at a rate greater than 0.5 mm/hour.

In another aspect, the present invention may be defined as an apparatus for the growth of bulk single crystals of AlN at enhanced growth rates by depositing vapor species of Al and N on the crystal growth interface of a seed crystal, said apparatus comprising a furnace chamber, a heater, a thermal sink, a seed holder thermally linked to said thermal sink, a source material supply and a temperature control system for maintaining a sufficiently low temperature at the growth surface of the seed crystal to create a sufficient thermal gradient along which the vapor species move to the crystal growth interface and an effusion system for sweeping away impurity atoms/molecules and non-stoichiometric vapor constituents at the crystal growth interface.

In yet another aspect, the present invention may be defined as a bulk, low impurity single crystal of AlN grown by deposition of vapor species of Al and N on a seed crystal growth surface. The bulk single crystal has a sufficient size and sufficient purity to permit its use in electronic applications, with the crystal having a diameter greater than about one inch and the purity of the crystal being characterized by the crystal lattice structure thereof having a level of nonintentionally introduced impurities below about 450 ppm.

In another aspect the present invention may be defined as a prepared substrate comprising an AlN single crystalline wafer with a deposited thin film of AlN thereon, and the method of producing such a prepared substrate.

BRIEF DESCRIPTION OF THE DRAWINGS

Some of the features of the invention having been stated, other features will appear as the description proceeds, when taken in connection with the accompanying drawings, in which

FIG. 10 shows portions of a crystal growth system with a crucible having a very low height-to-diameter aspect ratio.

FIG. 12 is a section view of a prepared substrate comprising a single crystalline AlN wafer cut from a crystal of the invention with an AlN epitaxial layer thereon.

DETAILED DESCRIPTION OF THE INVENTION

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Figure 1:
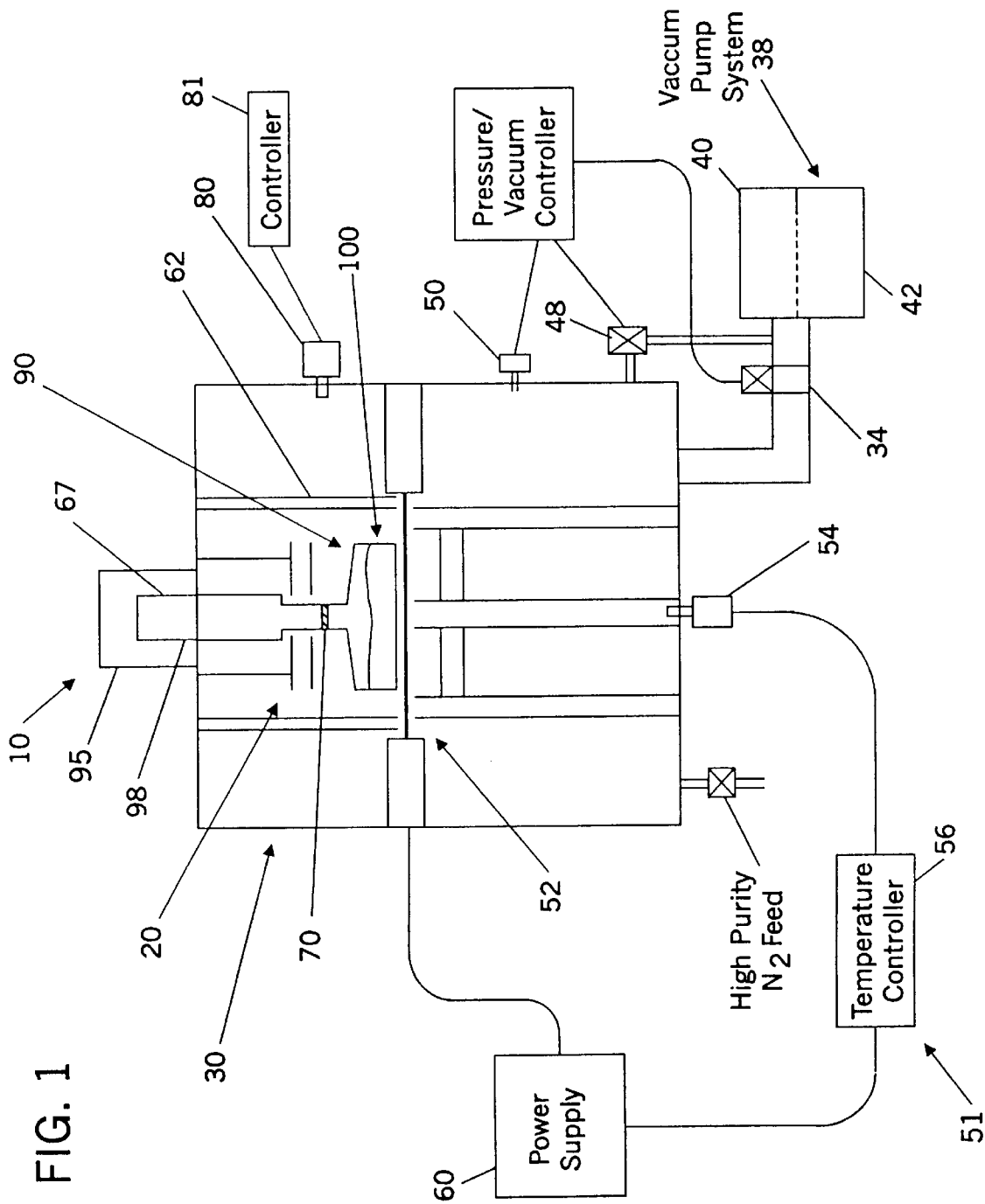
FIG. 1 is a schematic representation of the overall system for growing bulk single crystals of aluminum nitride.
Figure 2:
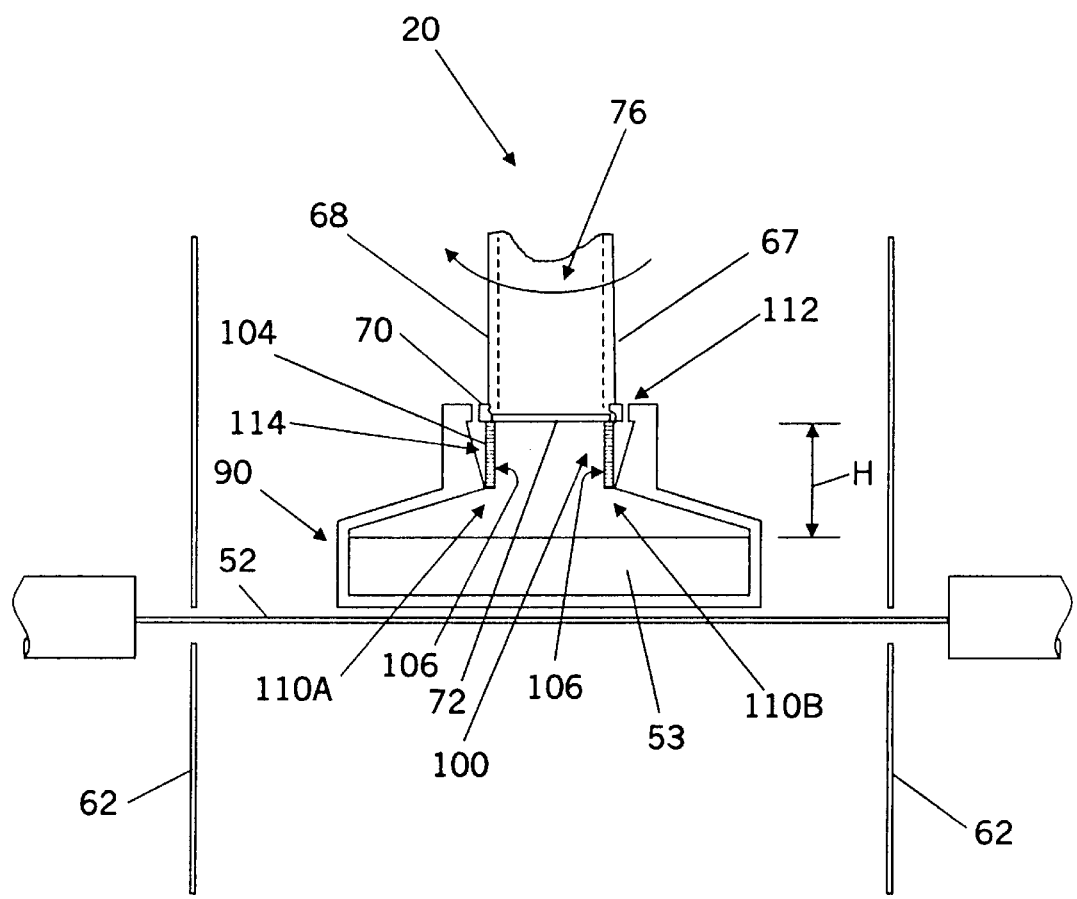
FIG. 2 is a view of the central subassembly of FIG. 1 showing details of a first embodiment of the effusion system.

Referring to the drawings, and particularly to FIG. 1, there is shown a schematic for the principal components of the overall system 10 for growing bulk single crystals of AlN according to the present invention. Growth system 10 includes a central subassembly generally indicated at 20. This subassembly incorporates the crucible 90, heating apparatus 51, thermal sink 67, seed holder 70, effusion system 100 and related structure, all of which serve to support the seed crystal and control the environment at the growing crystal interface during crystal growth operations. The central subassembly, and particularly the effusion system, may take various forms within the general parameters of the invention. Several embodiments are illustrated in the drawings. In the overall schematic of FIG. 1, the subassembly 20 of FIG. 2 is shown and will now be described in detail along with the remaining components of growth system 10.

System 10 includes a furnace chamber 30 that is fabricated from 316 stainless steel or other suitable material. Chamber 30 is water cooled (detail not shown) according to principles well known in the art. System pressure within chamber 30 below 10 torr is controlled via a throttle valve 34 (for example, a 3 inch diameter throttle valve manufactured by MKS Instruments, Inc. of Andover, Mass., USA) located in series with a vacuum pumping system 38. In accordance with techniques known in the art, the vacuum pumping system 38 is composed of a mechanical pump 40 to reduce the system pressure to the $10^{-3}$ torr and a turbo-molecular pump 42 to pump the system down to $10^{-5}$ torr. Pressure control above 10 torr is maintained through a magnetic control valve 48 that is also in series with vacuum pumping system 38. System pressure is measured from $10^{-3}$ torr to 1,000 torr with a highly accurate temperature controlled absolute capacitance manometer 50 such as the MKS Instruments, Inc., model no. 390.

Heat to system 10 is supplied by a resistance heating apparatus 51 including a horizontal thin plate heating element 52, preferably formed of graphite or tungsten. Heating element 52 may take the form of a single horizontal plate as illustrated in FIG. 2, or in the alternative, a pair of horizontal plates with one plate located below the crucible 90 and one plate above the crucible, or other forms discussed below. Temperature control is facilitated by an optical pyrometer 54 (FIG. 1) sited on the back of the heating element. Pyrometer 54 provides a constant input signal to a digital temperature controller 56 that maintains the temperature at a set point by controlling the output of a power supply 60. According to principles known in the art, heat generated by heating element 52 is shielded from the stainless steel walls of chamber 30 by heat shields 62, preferably formed of graphite. The temperature at the source should be held in the range from about 2025° C. to about 2492° C.

Regardless of the precise form taken by the horizontal plate heating element, such an arrangement enables the system to maintain a highly uniform thermal profile across a large diameter growing crystal interface allowing the growth of large diameter bulk single crystals and the use of a crucible having a very low ratio of height (H) to diameter (D), where H is the distance from the seed to the source (e.g., source material 53 in FIG. 2) and D the diameter of the crucible in the space between the seed and the source. Where this diameter is not constant, an average diameter is used. In those cases where the crucible does not have a circular or near circular cross section between the seed and the source, an equivalent diameter may be calculated by determining the internal volume of the crucible from the seed to the source (a volume having a height, H) and then calculating the diameter of an upright cylinder having the same height, H, and the same volume. This diameter is an equivalent diameter that may be used as the diameter, D, in the aspect ration H:D. Thus, as used herein the term "diameter, D," or "D" when used in conjunction with an aspect ratio shall refer to an actual crucible diameter, an average crucible diameter or an equivalent crucible diameter as set forth above. The low aspect ratios of the invention, preferably a ratio less than about 6:1, virtually eliminate the vexing mass transport problems caused by viscous interaction of the source vapor with the crucible walls and permits improved vapor stoichiometry at the growing crystal interface, as discussed in more detail herein. More particularly, according to one structure in the form illustrated in FIG. 2, the height (H) from source material 53 to the growing crystal interface may be on the order of 7.5 cm and the diameter (D) of the crucible on the order of 20 cm, resulting in an H:D aspect ratio of approximately 0.375:1. This geometry, coupled with a typical temperature difference between the source material and seed crystal of approximately 82° C., results in a relatively steep thermal gradient of approximately 11° C./cm. This structure offers numerous advantages as discussed herein, including high growth rates and the ability to grow large diameter, high purity crystals.

It will be appreciated that while aspect ratios of the invention may be broadly designated as less than about 6:1, lower aspect ratios are more desirable, for example, aspect ratios on the order of 1:3 and lower.

The mechanism for aligning, supporting and transferring heat away from the seed crystal 72 includes a thermal sink 67 comprising a tube 68 that has a lip structure 70 at the bottom thereof for receiving the seed 72. Thermal sink 67 also includes a thermal sink rod 76 that is threaded into tube 68 and is tightened down upon the seed so as to press firmly upon the seed. Tube 68 and rod 76 are preferably formed of high density graphite having a very high thermal conductivity.

Figure 3:
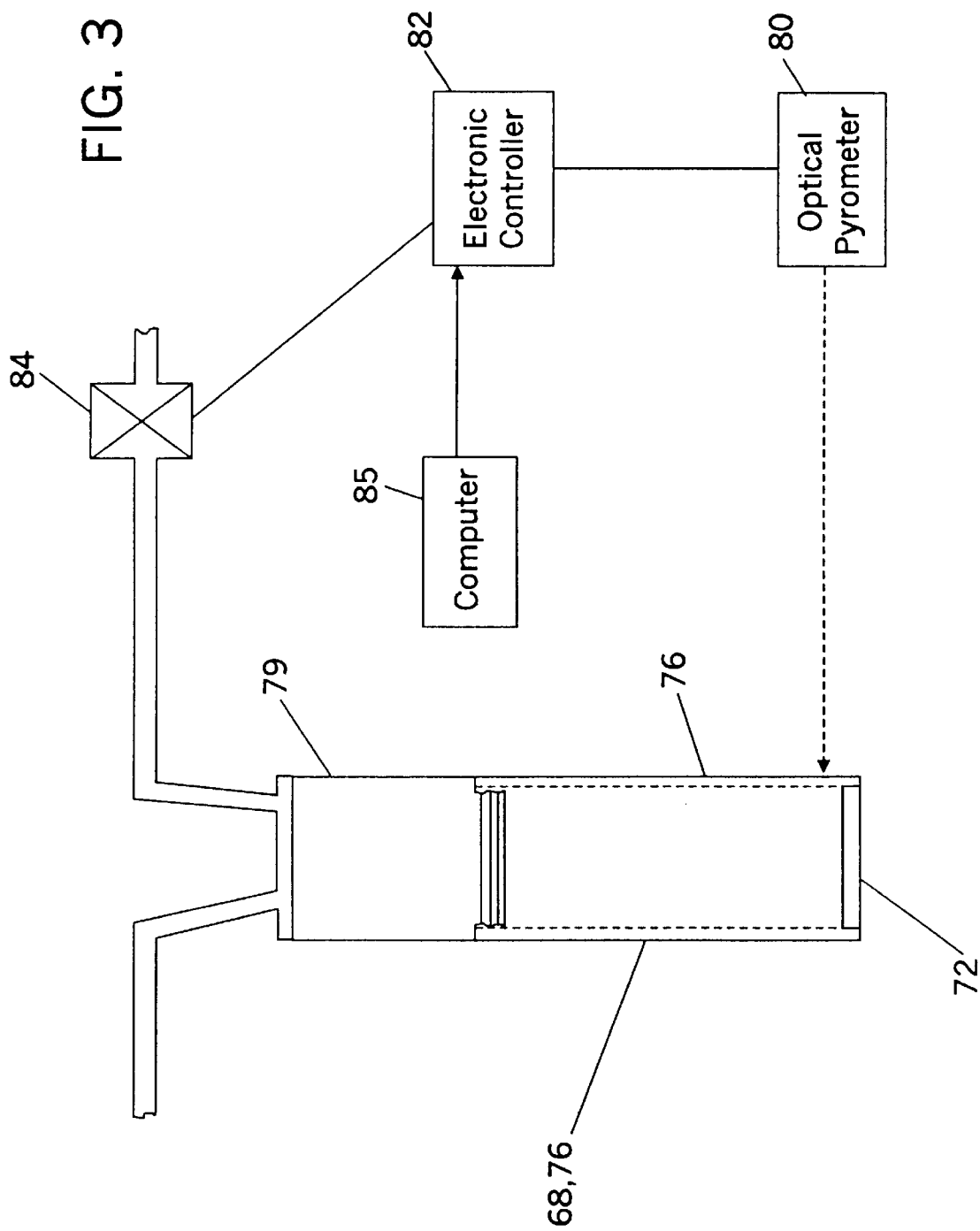
FIG. 3 is a simplified depiction of the thermal sink of the central subassembly of FIG. 2 shown in conjunction with a schematic representation of the open loop temperature control system for the crystal interface.

Referring to FIG. 3, further details of the seed cooling system are shown. This regard, rod 76 is connected to a water-cooled stainless steel rod 79. Water flow through stainless steel rod 79 and rod 76 is adjusted to maintain the desired seed temperature as read by an optical pyrometer 80. Preferably, this system is automated by inputting the signal from optical pyrometer 80 to electronic controller 82 linked electronically to a valve 84 controlling the water flow to the thermal heat sink. The controller 82 receives its command from a computer 85 that includes a look-up table in ROM or other suitable memory location. The look-up table is created from empirically derived data representative of the extent to which the temperature at the point read by optical pyrometer 80 must decrease over the crystal growth cycle in order to maintain a constant temperature at the crystal interface as the growing crystal interface moves closer to the source. Thus, the heat transfer rate of the thermal sink is increased during the crystal growth cycle as necessary to maintain a constant temperature at the growing crystal interface. The temperature at the growing crystal interface should be held in the range from about 1900° C. to about 2488° C.

Referring to FIG. 1, system 10 provides a mechanism 95 (shown schematically) for rotating the seed crystal about a vertical axis during the crystal growth cycle in order to dampen the effect of thermal discontinuities in the heating element and provide a uniform thermal profile across the growing crystal interface. In this regard, the structure of the central subassembly 20 of FIGS. 1 and 2 permits the crucible 90, which is secured to the thermal sink 67, to be suspended within chamber 30 so that the crucible bottom is a selected distance above the flat heating element 52, in one embodiment approximately 2 mm above. To this end, the thermal sink is supported by the top of chamber 30 at 98 and is rotatable by mechanism 95, preferably a stepping motor. Thus, the bottom of crucible 90 rotates above heating element 52 so that thermal discontinuities in heat transfer from the heating element to the crucible are dampened out.

The system for maintaining effusion at the growing crystal interface will now be described. According to the embodiment illustrated in FIGS. 1 and 2, effusion system 100 includes a cylindrical effusion baffle 104 located directly below seed crystal 72 in the path along which the species vapor from the source material moves to the relatively cooler growing surface of the seed. As mentioned above, the primary purpose of the effusion system is to sweep impurity atoms/molecules and non-stoichiometric vapor constituents away from the growing crystal interface. To this end, effusion baffle 104 includes a series of effusion openings 106 through which a constant flow is maintained for carrying away gases from the crystal growth interface. Openings 106 may take the form of a plurality of symmetrically disposed holes in the cylindrical wall of baffle 104, for example, a plurality of lines of vertically aligned holes located at a selected circumferential spacings on baffle 104. In this regard, the use of two vertical lines of holes at a 180° spacing along the cylindrical baffle wall is one desirable embodiment. Two lines of holes 110A and 110B are shown in FIG. 2. The illustrated effusion system 100 also includes a master effusion outlet 112 formed in the top of crucible 90. Outlet 112 is in fluid communication with the effusion holes of baffle 104 through a tapered ring chamber 114 for the purpose of drawing out gas at the interface. While the master effusion outlet may take any suitable form, it should be symmetrically disposed with respect to the crystal and may consist of, for example, a number of symmetrically disposed vertical openings in the top of the crucible, two of which are shown in FIG. 2. Preferably, the lines of effusion holes at 110A–D, the tapered ring chamber 114 and the master effusion outlet 112 are so configured as to permit a constant, controlled rate of effusion throughout the crystal growth process.

In one preferred embodiment of the effusion system 100 shown in FIG. 2, the vertically aligned holes at 110A and B are sized so that the hole diameter decreases sequentially beginning at the seed down to the bottom of the effusion baffle 104. Thus, as the crystal grows and the growing crystal interface moves toward the source, the larger holes are sequentially covered by the grown crystal so that the gas velocity increases through the remaining holes. As a result, with the proper location and sizing of the holes, and with the proper sizing of chamber 114 according to known fluid dynamics principles, the flow rate of effusion throughout the crystal growth cycle may be maintained substantially constant, while also encouraging the effusion gas to flow upwardly to and across the growing crystal interface before exiting through the holes at 110A and B and the master effusion outlet.

It will be appreciated that the precise geometry of the effusion system 100 shown in FIGS. 1 and 2, including the size of the fluid flow paths therein, may be best determined by taking into account several factors, primarily, the size and total vapor flow rate of the growth system, system pressures both inside and outside of the crucible, the flow rate of any effusion-assist gas, and system temperature. In operation of an effusion system such as system 100 without an effusion-assist gas, an effusion rate greater than 2% of the total vapor flow rate is desirable, typically in the range of about 2% to about 80%. More particularly, an effusion rate in the range of about 20% to about 50% of the total vapor flow rate is deemed more desirable, while a rate in the range of about 30% to about 35% is preferred.

While not illustrated, one desirable way to maintain constant effusion in a system such as the illustrated system 100, or other Such systems, is to link the master effusion outlet to a very high accuracy low pressure absolute capacitance manometer located outside of the chamber, with the manometer being linked to an electronic controller and associated control valve and vacuum pump to bleed gas as necessary to maintain a predetermined constant pressure reading at the manometer. Using the same apparatus, a very high accuracy differential capacitance manometer measuring the pressure drop across a fixed orifice or other suitable technique could be substituted for the absolute manometer. Also, a thermal mass flow controller could be used as the means for maintaining constant effusion.

Figure 4:
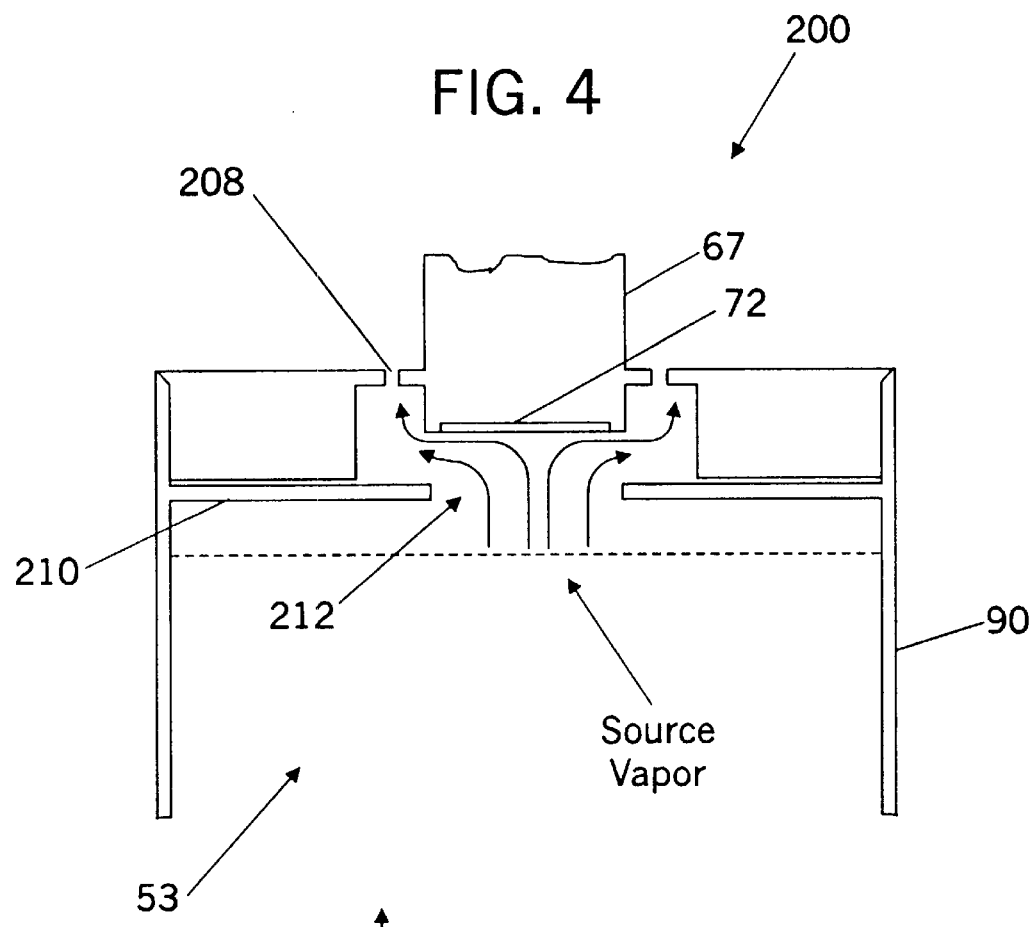
FIG. 4 shows a first alternative embodiment of the effusion system.

In another embodiment shown in FIG. 4, effusion system 200 includes a master effusion outlet 208 that is located beyond the periphery of the seed crystal at approximately the same level or higher than the seed so that the source vapor must travel onto, across, and off of the crystal growth interface to reach the effusion outlet. As illustrated, effusion outlet 208 is higher than the seed. In order to achieve desirable effusion, effusion system 200 includes a horizontal effusion baffle 210 including one large opening 212 centered directly in front of the seed through which the source vapor and any effusion-assist gas must pass prior to reaching the seed. As alternatives to having one central opening in the effusion baffle, the baffle may include a series of symmetrically disposed smaller openings centered directly in front of the seed, or the baffle may be formed from porous graphite or other suitable porous material centered directly in front of the seed.

Figure 5:
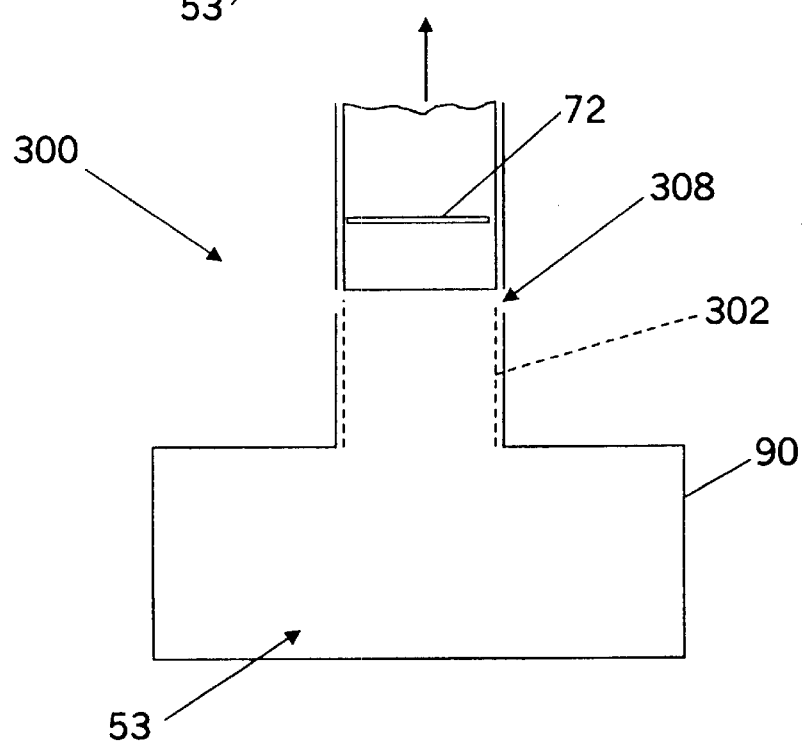
FIG. 5 shows a second alternative embodiment of the effusion system.

In yet another embodiment shown in FIG. 5, effusion system 300 includes a cylindrical insert tube 302 that contains vertical columns of symmetrically disposed effusion outlets, grooves or vertical slots. This cylindrical insert tube is pulled upwardly by a raise/lower mechanism (shown schematically) past a fixed master effusion outlet 308 in the crucible sidewall so that an outlet for effusion of impurity atoms is always present just below the crystal growth interface.

Figure 6:
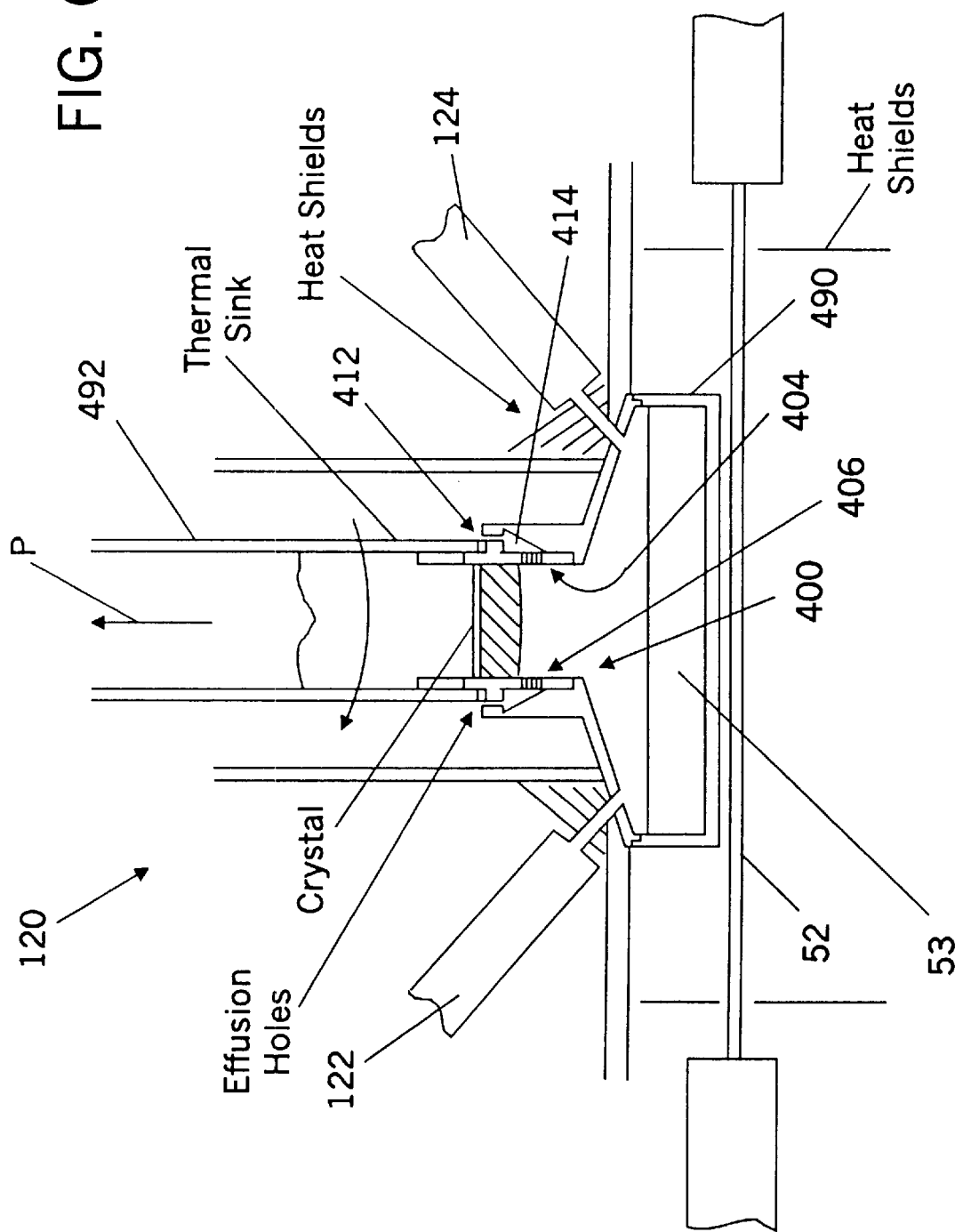
FIG. 6 shows a third alternative embodiment of the effusion system that is used in conjunction with a fixed crucible and a crystal pulling mechanism.

Referring now to subassembly 120 of FIG. 6, there is shown another embodiment of the central subassembly that has several structural and functional differences from the subassembly 20 of FIG. 2. In this regard, FIG. 6 illustrates another effusion system 400 that is used in conjunction with a pulling mechanism that raises the crystal as it grows, thereby maintaining the growing crystal interface in the same relative position throughout the growth cycle. According to the embodiment of FIG. 6, crucible 490 is fixedly supported within the growth chamber by an outer sleeve 492, while the thermal sink and seed are suspended from the top of the chamber. Thus, the thermal sink and seed are detached from the crucible so that they may be pulled upwardly (arrow P) at a rate corresponding to the rate at which the crystal grows. The pulling of the seed may be accomplished by a closed loop control coupled to a stepping motor. As an alternative, the growth rate may be calculated or estimated from observed historical growth information, with the pulling mechanism programmed to match the calculated or observed rate. When the crystal is pulled the system for controlling the temperature at the crystal growth interface may take the form of a control as illustrated in FIG. 3 without utilizing the computer. Because the optical pyrometer 80 will be directed to the same position relative to the crystal growth interface throughout the growth cycle, the sensed temperature will always directly reflect the temperature at the crystal interface without requiring the use of a computer and look-up table to correct for movement of the interface due to crystal growth.

The effusion system 400 includes a cylindrical effusion baffle 404 having effusion openings 406 in the baffle sidewall at symmetrically disposed locations therearound and just below the growing crystal interface. Openings 406 communicate through a tapered chamber 414 to a master effusion outlet 412 in the crucible top wall. Because the pulling mechanism locates the growing crystal interface at the same position throughout the growth cycle, the interface does not move with respect to the effusion system, thereby providing reliable flow characteristics facilitating a constant effusion rate.

It will be appreciated that other effusion system geometries may be utilized, with the understanding that the primary purpose of the effusion system is to provide effusion at the crystal growth interface to sweep away impurity atoms/molecules and stoichiometric excess.

Subassembly 120 of FIG. 6 also includes a pair of gas injectors 122, 124 that are provided in order to (i) supply an effusion-assist gas, or (ii) supply a source gas or (ii) supply a gas that serves both purposes by supplementing the supply of vapor species from another source (e.g., solid source 53) while also assisting effusion.

When using the gas injectors 122, 124 of subassembly 120 to inject an effusion-assist gas (e.g., nitrogen or argon), the flow rate preferably is maintained at a continuous level sufficient to assist in removing impurity atoms/molecules and stoichiometric excess from the crystal growth interface.

When the gas injectors 122, 124 of subassembly 120 are used to provide source material, the growth system can run for much longer times without the variation in growth chemistry that occurs when crystalline solids sublime preferentially. In addition, utilizing a gas injection system for a continuous flow of source material also offers the flexibility to optimize growth rates by supplying source material in different ratios and forms such as $N_2$ and N ions. Because the $N_2$ atomic bond is very strong, the addition of nitrogen ions or excited $N_2$ to the source vapor will significantly increase the growth rate of AlN single crystals. In this regard, the growth of AlN single crystals involves the significant rate limiting reaction $\frac{1}{2}N_{2(g)} \rightarrow \frac{1}{2} N_{2(ads)} \rightarrow N_{(ads)}$. The presence of atomic nitrogen, nitrogen ions or excited $N_2$ in the growth crucible aids in overcoming this limitation on the growth rate. The addition of atomic nitrogen, nitrogen ions or excited nitrogen may be facilitated by the use of a laser or other system to create atomic nitrogen, nitrogen ions or excited nitrogen either before or after injection into the growth crucible.

The use of an effusion-assist gas such as nitrogen or argon may be employed to increase the effusion rate. In this regard, the effusion-assist gas may be injected directly below or directly at the crystal growth interface to increase the gas flow rate across the growing crystal interface and through the effusion baffle. The effusion-assist gas may also be injected directly into the area between the effusion baffle outlet and the master effusion outlet to increase the effusion rate through the effusion baffle. In gas-assisted effusion operations, effusion at the growing crystal interface should be in the range from about 12% to about 99.9% of the total vapor flow rate. In this regard, the term "total vapor flow rate" as used herein refers to the total gas flow, including (i) source vapor flow supplied from sublimation, source gas injection, vaporized liquid Al, or otherwise and (ii) effusion-assist gas flow.

The effusion system may also be operated in such a way that the gas pressure in the growth chamber is decreased during the growth run so as to maintain a constant effusion rate as the crystal grows down the effusion baffle. In this regard, the master effusion hole or holes may be located beside the seed where effusion is maintained at a constant rate by decreasing the gas pressure in the growth chamber during the crystal growth run by use of the pressure controls shown in FIG. 1.

Figure 7:
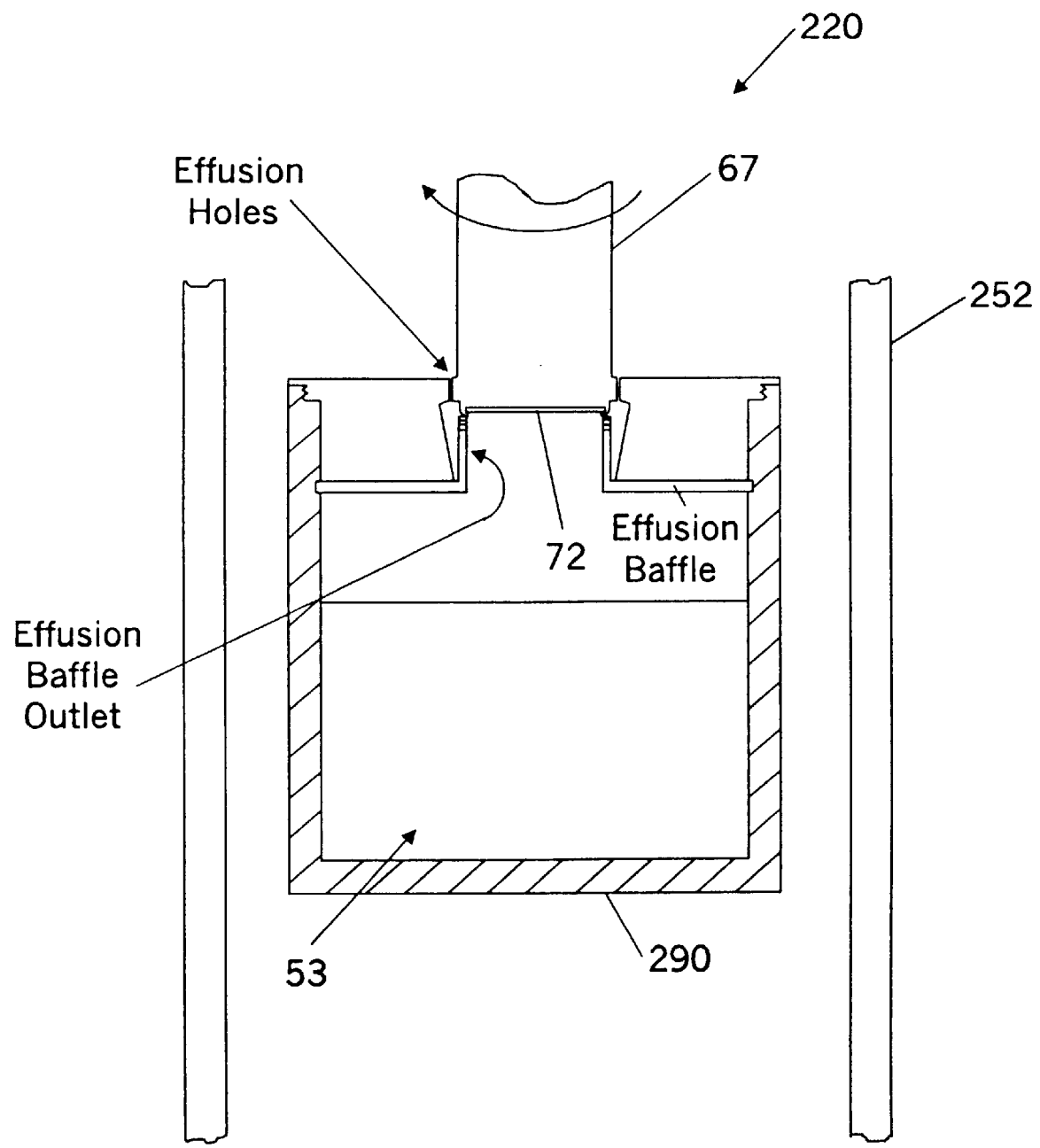
FIG. 7 shows a crystal growth system with a cylindrical resistance heating element.

Referring now to FIG. 7, there is shown yet another central subassembly 220 that includes a cylindrical resistance heating element 252 that is encased within a water-cooled furnace chamber not shown. Heating element 252 is utilized to heat the seed crystal located within a crucible 290 that is similar to the crucibles described above, but crucible 290 has a substantially greater height due to the heat transfer capabilities of the vertical cylindrical heating element.

Figure 8A:
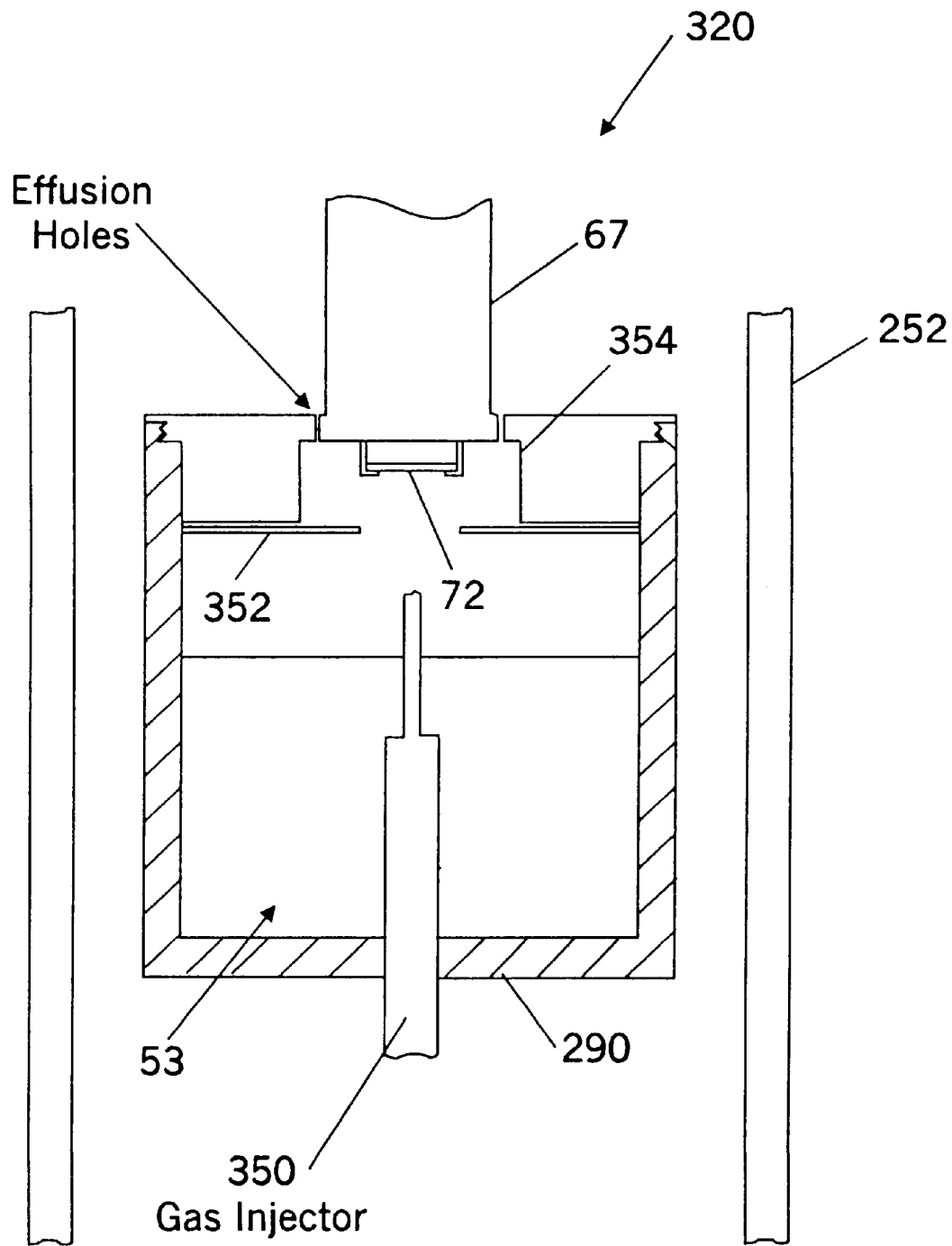
FIG. 8A shows a crystal growth system similar to that of FIG. 7, but with a gas injector and a modified form of effusion system.

FIG. 8A illustrates a subassembly 320 that is similar in general shape and construction to the subassembly of FIG. 7 with the exception that a gas injector 350 is utilized to inject argon or nitrogen into the crucible to serve as an effusion-assist gas. The injected gas is directed by an effusion baffle 352 into a cylindrical housing 354 that provides a gas flow conduit leading to the seed crystal. A plurality of effusion holes are located at the top of housing 354 for sweeping away impurities at a gas flow rate that corresponds to the injected gas input rate.

While not illustrated, it will be appreciated that heat may be supplied to the growth system by a combination heating arrangement including both a horizontal flat plate heater such as heater 52 of FIG. 2 and a cylindrical heater such as heater 252 of FIGS. 7 and 8. In such a structure, the primary heat to the system and the creation of a uniform (horizontal) thermal profile in the crucible is accomplished by heater 52, while vertical cylindrical heater 252 is used to provide a heat source to accommodate edge effects on the upstanding crucible walls. As a refinement to this combination heating system, the vertical cylindrical heater may be replaced with a plurality of stacked heater rings (not shown) surrounding the crucible. The rings are electrically and physically isolated from each other and independently controlled so that the thermal gradient may be varied as desired up the vertical axis of the crucible.

Figure 8B:
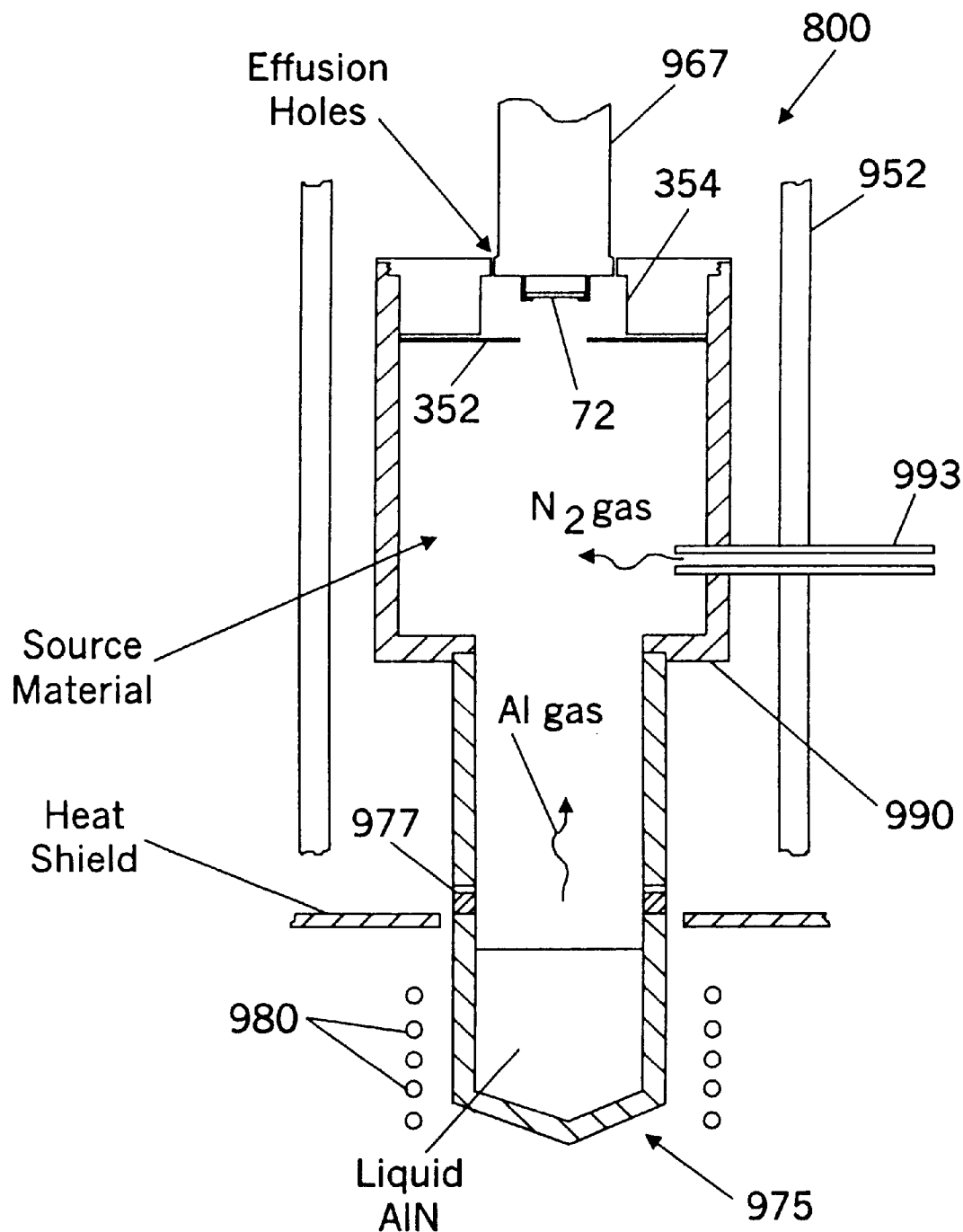
FIG. 8B shows a vapor source apparatus that is used to create a constant flow of aluminum and $N_2$ source vapor.

FIG. 8B illustrates a vapor source apparatus 800 that is utilized to create a constant flow of aluminum and $N_2$ source vapor. In this system Al vapor produced by heating liquid Al to a specific temperature is combined with $N_2$ in the growth crucible to produce the desired flow and stoichiometry of source vapor. Therefore, by controlling the vapor pressure of the Al liquid by controlling its temperature in combination with controlling the injected $N_2$ gas with a thermal mass flow controller, this system provides excellent control of the effusion rate and vapor stoichiometry. More particularly, vapor source apparatus 800 includes a graphite crucible 990 having the shape shown in FIG. 8A, a cylindrical resistance heating element 952, a thermal sink 967 holding a seed 72 and an effusion system similar to the effusion system shown in FIG. 4. Liquid Al is contained in a lower crucible 975 that is electrically insulated at 977 by a BN insulator ring, or a physical gap, or other suitable means. Crucible 975 may be a cold crucible, for example, a water-cooled copper crucible the contents of which is heated by a water-cooled induction heating coil 980 as shown in FIG. 8A. Alternatively, crucible 975 may be formed of high density graphite, pyrolytic graphite, silicon carbide coated graphite or boron nitride. These crucibles may be heated by either resistance heating or induction heating, as appropriate. Al gas enters crucible 990 from the liquid Al while $N_2$ gas is injected through injector 993. The liquid Al is maintained at a temperature sufficient to create a suitable vapor flow under the conditions maintained in the crucible, particularly crucible pressure. Typically the liquid Al temperature will be maintained between about 1000° C. and 2400° C. to create a suitable vapor flow rate under system conditions, with a temperature below about 2200° C. being preferred. The temperature within the crucible is maintained at a temperature higher than that of the liquid Al. The area inside the crucible becomes saturated with Al and $N_2$ vapor that condenses at the cooler seed growing interface. While not illustrated, a horizontal baffle plate with a central opening may extend across crucible 990 above insulator ring 977 to create a pressure gradient thereacross and a velocity increase to the Al vapor moving into crucible 990, thereby reducing the back diffusion of $N_2$ toward the liquid Al.

It will be appreciated that the system of FIG. 8A permits the use of very pure source vapors and the ability to carefully control the stoichiometry. These factors, coupled with the preferential placement of the seed crystal near the molten Al, makes possible the operation of a system such as that shown in FIG. 8A with little or no effusion, with it being understood that effusion is preferred.

Figure 9A:
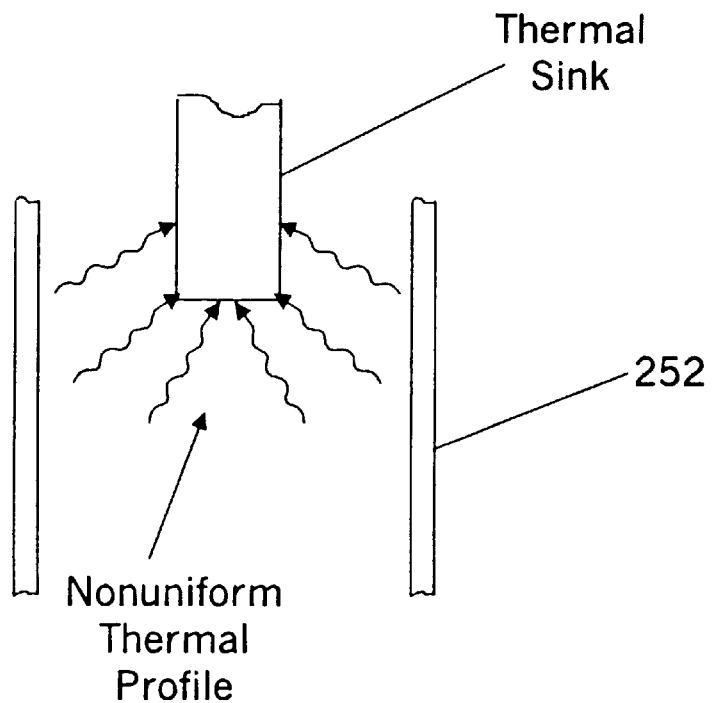
FIG. 9A shows the thermal profile between a cylindrical heating element and a thermal sink.
Figure 9B:
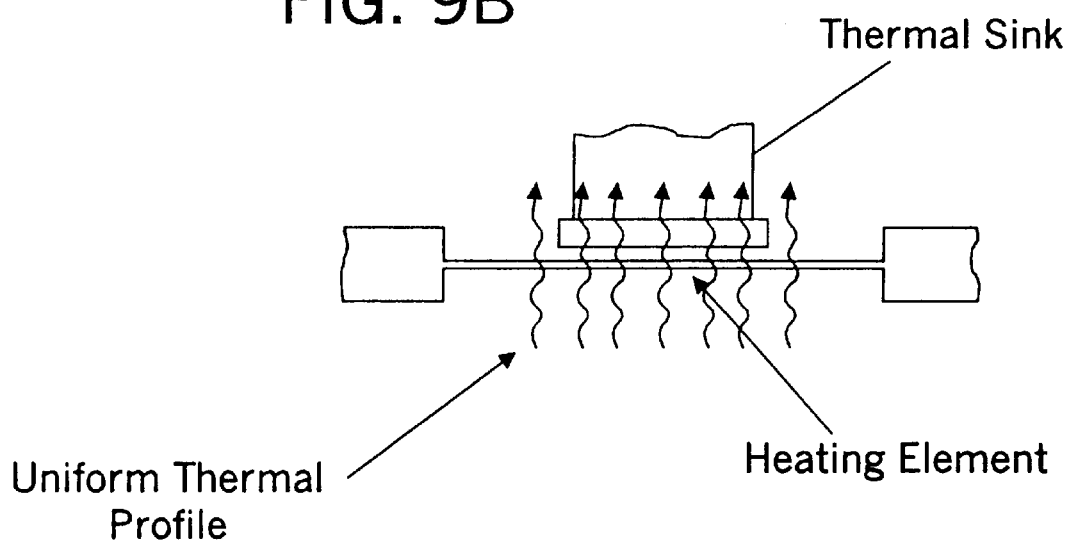
FIG. 9B shows the thermal profile between a flat plate heating element and a thermal sink.

FIG. 9A illustrates the non-uniform thermal profile between the cylindrical heating element 252 and the thermal sink, while FIG. 9B illustrates the uniform thermal profile between the horizontal heating element 52 of the earlier-described embodiments and the thermal sink.

Figure 11A:
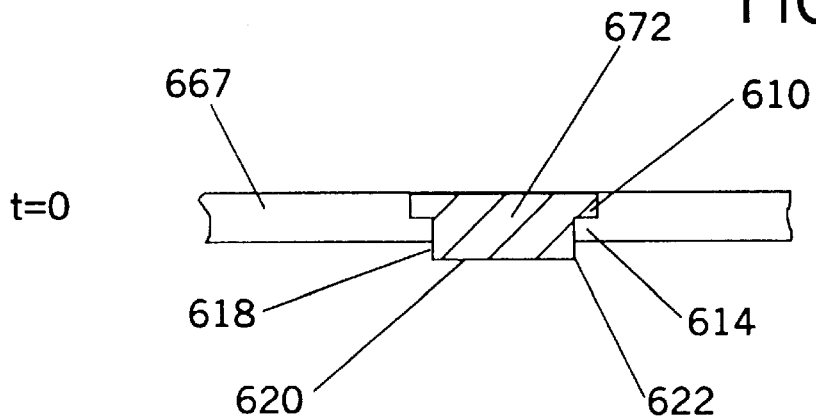
FIGS. 11A–D are enlarged views of the bottom of the thermal sink of FIG. 10, the seed crystal secured to the thermal sink and the advancing crystal growth interface at four points in a representative growth cycle.

FIG. 10 illustrates portions of a crystal growth system having a crucible with a very low height to diameter (H:D) aspect ratio and other features specifically designed to grow large diameter AlN crystals. The source material 53 is a solid material that is spaced very closely to the seed crystal 672 to produce an H:D aspect ratio less than about 2.5:1, typically below 1:3, and most preferred on the order of 1:8. The effusion system is similar to the effusion system shown in FIG. 4 and described above. In order to encourage growth of a large diameter crystal, the seed crystal is mounted to the thermal sink 667 so that a portion of the seed extends below the lower, polished flat surface of the thermal sink. To this end, the seed is cut to create an outwardly projecting circumferential lip 610 (FIG. 11A) that rests on a circular shoulder 614 formed at the periphery of an opening 618 extending through the bottom of the thermal sink. This arrangement permits the lower portion of the seed to protrude beyond the thermal sink to expose not only the seed growth surface 620, but also the circumferential outer wall portion 622 of the seed. The growth of the seed directly outwardly from the wall portion 622 (i.e., in a horizontal plane) facilitates growth of a large diameter crystal, especially in those cases where, as is preferred, the main growth direction (i.e., vertical) is off the basil plane of the seed. This seed orientation produces an even faster growth rate in the horizontal direction.

The low aspect ratio system of FIG. 10 may be utilized according to the invention with a very pure source material 53 to grow bulk crystals of AlN without use of effusion. In this regard, the source material in solid or liquid form has less than about 0.08% excess Al content, less than about 0.05% non-dopant/non-alloying electrically active impurity content, and less than about 400 ppm oxygen content by weight. The H:D aspect ratio is less than about 2.5:1, typically less than 1:3, and most preferably less than 1:8.

According to the invention, the system of FIG. 10 may also be used little or no effusion to grow bulk AlN crystals by utilizing a low H:D aspect ratio below 1:3, and preferably below 1:8, with a horizontally disposed flat plate heater located directly below the flat bottom of the crucible.

Figure 11B:
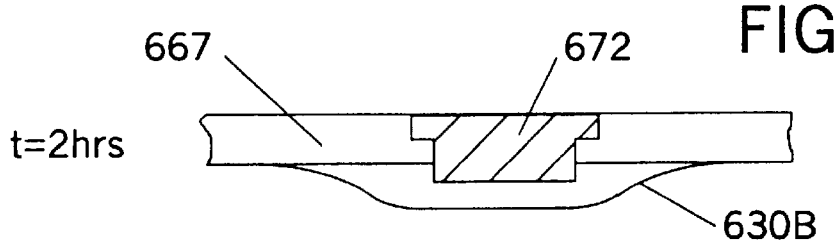
Figure 11C:
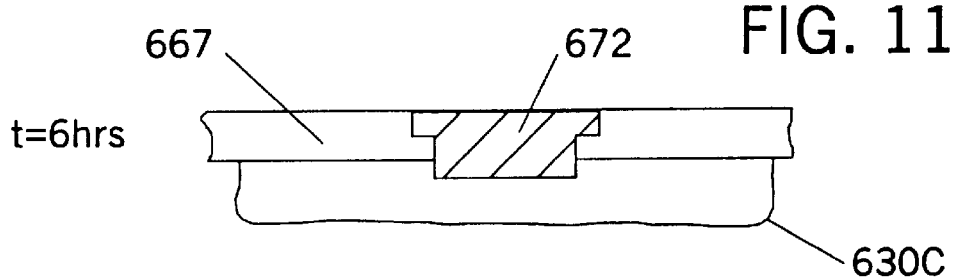
Figure 11D:
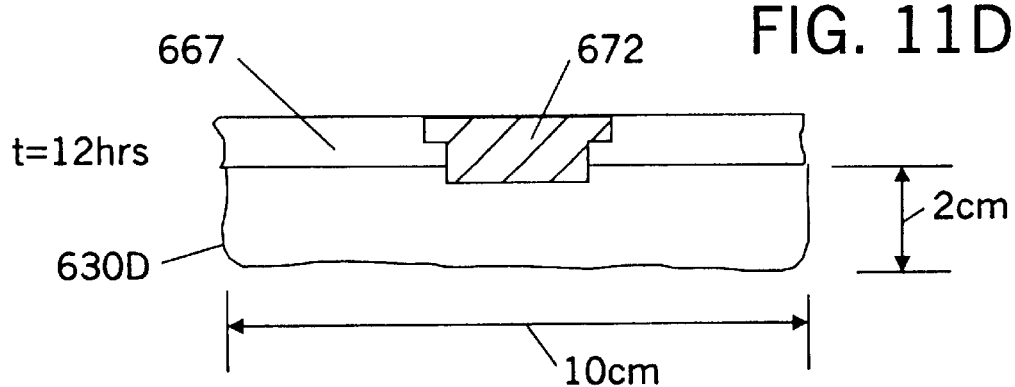

FIGS. 11B–D are enlarged views of the seed and thermal sink of FIG. 10 showing the advancing crystal growth interface 630B, 630C, 630D at growth cycle times t=2 hours, t=8 hours and t=12 hours, respectively. For a representative example, the seed has an exposed diameter of 25 mm and the bottom of the thermal sink has a diameter of 112.5 mm. At the conclusion of a twelve hour growth cycle the grown crystal has a diameter of 100 mm and a height of 20 mm.

It will be appreciated that the appropriate selection of source material and source material form (i.e., solid or gas or a combination) and the intentional introduction of doping materials or alloy-producing materials may be used to specifically tailor the operation of the growth system to produce a desired crystal structure and composition. Examples are as follows:

(1) Use of solid undoped AlN as a source material to intentionally grow intrinsic AlN.

(2) Use of solid AlN intentionally doped with a specific impurity level as a source material to intentionally grow p-type, n-type or compensated AlN.

(3) Use of a combined source consisting of solid AlN doped or undoped with impurities in combination with injected source gas or gases.

(4) Use of atomic nitrogen, $N_2$, nitrogen ions, $Al(CH_3)_3$, $NH_3$, $AlCl_3$, Al vapor or other gas sources alone or in combination with the materials in (3), above.

(5) Use of atomic nitrogen, $N_2$, nitrogen ions, $Al(CH_3)_3$, $NH_3$, $AlCl_3$, Al vapor or other gases alone or in combination as the source material.

(6) Use of a microwave, laser or other system to create atomic nitrogen, nitrogen ions or excited nitrogen either before or after injection into the growth crucible.

(7) Use of AlN solid or gas source materials containing sufficient levels of other elements to form alloys or other chemical combinations of AlN containing greater than 50% Al and N.

(8) Use of AlN solid or gas source materials containing sufficient levels of BP to form all alloys of AlN:BP.

(9) Use of AlN solid or gas source materials containing sufficient levels of In to form all alloys and compounds of $Al_x In_y N$, where X is 0→1.

(10) Use of AlN solid or gas source materials containing sufficient levels of In to form $Al_{0.8}I_{n02}.N$.

It will be appreciated that the seed crystal on which the bulk single crystal of aluminum nitride is grown may be an aluminum nitride seed crystal or a silicon carbide seed crystal or a seed crystal formed from other suitable material such as single crystalline tungsten, single crystalline $Al_2O_3$ (below 2,040° C.) and alloys or other chemical combinations containing AlN.

EXAMPLE I

Bulk AlN single crystals are grown using AlN source crystals that have been sublimed at 1,950° C. for 10 hours to reduce the excess aluminum concentration to <0.05%. Next, the pyrolytic graphite growth crucible 90 of FIGS. 1 and 2 is loaded with 720 grams of AlN source crystals in a glove box under purified $N_2$ atmosphere. A 2.25 inch diameter 0.8 mm thick single crystalline on-axis 6 H SiC seed (basil plane orientation) is placed in the bottom of the high density graphite thermal sink tube 68 and secured in place by pressure exerted through thermal sink rod 76.

The effusion system components are properly positioned in the crucible and the thermal sink which is connected to the crucible top is screwed into place. The entire apparatus is then loaded into the crystal growth furnace chamber. After sealing the growth chamber, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. The crucible is then heated to a temperature of 300° C. Next, the growth chamber is pumped down to a pressure of $10^{-3}$ torr. The system is then back filled with high purity $N_2$ to a pressure of 1,000 torr.

The pressure is held constant at 1,000 torr by throttling gas through the magnetic control valve while the crucible bottom temperature, as measured by the optical pyrometer, is increased from 300° C. to 2,365° C. in a linear ramp over 2 hours and 15 minutes.

Next, the system pressure is reduced to 2 torr in a linear ramp over 30 minutes. The seed temperature, as measured by the optical pyrometer, is held at 2,260° C. by adjusting the water flow to the thermal sink.

The system is then held in this configuration for 14 hours with an effusion rate of $N_c 28\%$ of $N_r$. Next, the crucible temperature is reduced from 2,365° C. to 1,200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is removed from the crystal growth chamber. The resulting AlN crystal is two inches in diameter and 16–20 mm thick.

EXAMPLE II

Bulk AlN single crystals are grown using AlN source crystals that have been sublimed at 1,950° C. for 10 hours to reduce the excess aluminum concentration to <0.05%. Next, the high-density carbon impregnated graphite growth crucible 490 of FIG. 6 is loaded with 720 grams of AlN source crystals in a glove box under purified $N_2$ atmosphere. A 2.25 inch diameter 0.8 mm thick single crystalline on-axis 6 H SiC seed (basil plane orientation) is placed in the bottom of the high density graphite thermal sink tube 68 and secured in place by pressure exerted through the thermal sink rod.

The effusion system components are properly positioned in the crucible and the high density graphite outer sleeve is screwed into place. The entire apparatus is then loaded into the crystal growth furnace chamber and the graphite gas injectors are screwed into the crucible. After sealing the growth chamber, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. The crucible is then heated to a temperature of 300° C. Next, the growth chamber is pumped down to a pressure of $10^{-3}$ torr. The system is then back filled with high purity $N_2$ to a pressure of 1,000 torr.

The pressure is held constant at 1,000 torr by throttling gas through the magnetic control valve while the crucible bottom temperature, as measured by the optical pyrometer, is increased from 300° C. to 2365° C. in a linear ramp over 2 hours and 15 minutes.

Next, the system pressure is reduced to 2 torr in a linear ramp over 30 minutes. The seed temperature, as measured by the optical pyrometer, is held at 2,260° C. by adjusting the water flow to the thermal sink.

Next, $N_2$ is flowed at a total rate of 1.2 standard cubic centimeters per minute into gas injectors 122 and 124 via an MKS Instruments mass flow controller.

Finally, the vertical raise/lower mechanism is set to pull the seed up at a rate of 2 mm per hour.

The system is then held in this configuration for 24 hours with an effusion rate of $N_c 64\%$ of $N_r$. Next, the crucible temperature is reduced from 2,365° C. to 1,200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is then removed from the crystal growth chamber. The resulting AlN crystal is two inches in diameter and 44–48 mm thick.

FIG. 12 is a section view of a single crystalline AlN wafer 700 cut from a crystal of the invention and showing an epitaxial layer 702 of AlN thereon. The process for producing the prepared substrate structure of FIG. 12 is as follows. First, a bulk single crystal of AlN is grown according to the method and apparatus described above. Next, the wafer is cut from the bulk crystal using a technique known in the art, for example by using an inside diameter wafer saw. The wafer may be on the order of 0.6 mm thick and have a diameter on the order of three inches. The next step is to chemically polish the wafer by techniques commonly employed in the semiconductor industry, followed by a dry etching procedure for producing a surface on the wafer receptive to a thin film of AlN. At this point, the epitaxial layer of AlN having a thickness on the order of 1.5 to 2 microns is deposited on the mentioned surface of the wafer by a suitable process, for example, MBE, MOCVD or nitrogen plasma sputtering. The prepared AlN substrate is then ready to have a component formed thereon containing one of the following representative materials, with the material being doped n-type, p-type, intrinsic or compensated:

(1) $Al_{0.8}In_{0.2}N$
(2) $Al_xIn_yN$, where X is 0→1
(3) InN
(4) AlN doped p-type, n-type or compensated
(5) $Al_{0.8}In_{0.2}N/InN$
(6) BN
(7) BN/diamond
(8) diamond
(9) AlP
(10) InP.

The component so formed may have multiple layers, with the component material for at least some of the layers being chosen from:

(1) AlN
(2) $Al_xIn_yN$, where x is 0→1
(3) InN
(4) AlP
(5) BN
(6) diamond
(7) BP
(8) InP.

It will be appreciated that one aspect of the invention is the ability to grow bulk AlN crystals having a purity level that renders the crystal useful for commercial applications, particularly applications in the electronics industry. In this regard, crystals grown according to certain methods and apparatus of this invention preferably having a crystal lattice structure having a level of nonintentionally introduced impurities below about 450 ppm. The level of nonintentionally introduced electrically active impurities preferably is below 75 ppm.

When AlN crystals of the invention are intentionally doped n-type or p-type by deposition of vapor species of Al and N on a seed crystal growth surface in the presence of doping atoms, the crystal preferably has an electrical resistivity below 0.30 ohm-cm.

The growth of the bulk single crystal of AlN has been described primarily herein as being accomplished by what is commonly referred to as a "sublimation" technique wherein the source vapor is produced at least in part when crystalline solids of AlN or other solids or liquids containing AlN, Al or N sublime preferentially. However, as also disclosed herein, the source vapor may be achieved in whole or in part by the injection of source gases or like techniques that some would refer to as "high temperature chemical vapor deposition". Also, other terms are sometimes used to describe these and other techniques that are used to grow bulk single AlN crystals according to this invention. Therefore, the terms "depositing", "depositing vapor species" and like terns will sometimes be used herein to generally cover those techniques by which the crystal may be grown pursuant to this invention.

While the present invention has been described in connection with certain illustrated embodiments, it will be appreciated that modifications may be made without departing from the true spirit and scope of the invention.

That which is claimed is:

1. An apparatus for the growth of bulk single crystals of AlN at enhanced growth rates by depositing vapor species of Al and N on the crystal growth interface of a seed crystal, said apparatus comprising:

a furnace chamber, a heater, a thermal sink, a seed holder thermally linked to said thermal sink, a source material supply and a temperature control system for maintaining a sufficiently low temperature at the growth surface of the seed crystal to create a sufficient thermal gradient along which the vapor species move to the crystal growth interface; and an effusion system for sweeping away impurity atoms/molecules and non-stoichiometric vapor constituents at the crystal growth interface.

2. The growth apparatus of claim 1 including a crucible holding at least a portion of the source material in solid or liquid form and a horizontal heater positioned below the crucible.

3. The apparatus of claim 2 wherein said crucible has a diameter, D, and the distance between the source material and the seed is H, and the H:D aspect ratio is less than about 6:1.

4. The apparatus of claim 1 wherein said effusion system includes an upstanding cylindrical baffle located below the seed crystal in the path along which the species vapor moves to the relatively cooler growing surface of the seed, said baffle having symmetrically disposed holes in the wall thereof, and a fluid communication path between said baffle holes and an effusion outlet.

5. The apparatus of claim 4 wherein said fluid communication path comprises a ring chamber external of said baffle and said effusion outlet comprises an outlet from said chamber.

6. The apparatus of claim 4 wherein said baffle holes are larger at the top of the baffle and progressively smaller toward the bottom of the baffle.

7. The apparatus of claim 4 wherein said effusion system includes an effusion baffle providing a horizontally disposed gas passage located between the source and the seed through which the source vapor and any effusion-assist gas must pass before reaching the seed and an effusion outlet located beyond the periphery of the seed at approximately the same level or higher than the seed.

8. The apparatus of claim 4 including a crucible having an upstanding cylindrical portion at the top thereof and wherein said effusion system includes an upstanding cylindrical insert tube having effusion holes extending vertically along the wall thereof, said insert tube being inserted into said upstanding crucible portion and connected to a raising mechanism that pulls the insert tube upwardly as the crystal grows so that an outlet for effusion is always present just below the crystal growth interface through an effusion outlet in the crucible portion.

9. The apparatus of claim 4 including a pulling mechanism for raising the crystal as it grows to maintain the growing crystal interface in the same position throughout the growth cycle, and wherein said effusion system includes an effusion baffle with fixed effusion holes through which effusion gas passes throughout the growth cycle.

10. An apparatus for the growth of bulk single crystals of AlN at enhanced growth rates by depositing vapor species of Al and N on the growth surface of a crystal growth interface through the recondensation of sublimed Al-and N-containing source material, said apparatus comprising:

a furnace chamber;

a heater within said furnace chamber;

a crucible having a diameter, D, located within said furnace chamber and holding at least a portion of the source material in solid or liquid form, said source material having a purity defined by less than about 0.08% excess Al content, less than about 0.05% non-dopant/non-alloying electrically active impurities content, and less than about 400 ppm oxygen content by weight;

a seed holder holding a seed crystal within said crucible at a height, H, above the source material; and the H:D aspect ratio being less than about 2.5:1.

11. The system of claim 10 wherein said heater comprises a horizontally disposed heater located below said crucible.

12. The system of claim 14 wherein said H:D aspect ratio is less than about 1:3.

13. An apparatus for the growth of large diameter bulk single crystals of AlN by depositing vapor species of Al and N on the growth surface of a crystal growth interface through the recondensation of sublimed Al-and N-containing source material, said apparatus comprising:

a furnace chamber;

a crucible having a substantially flat bottom surface and a diameter, D, said crucible being located within said furnace chamber and holding at least a portion of the source material in solid or liquid form;

a horizontally disposed flat plate heater located below the flat bottom of said crucible in close spaced relation thereto for supplying heat to the system with a uniform horizontal thermal profile;

a seed holder holding a seed crystal within said crucible at a height, H, above the source material; and the H:D aspect ratio being less than about 1:3.

14. The system of claim 13 wherein said seed holder holds the seed crystal with not only the seed primary growth surface being exposed, but also a portion of the outer wall of the seed being exposed.

15. The system of claim 14 including an effusion system for sweeping away impurity atoms/molecules and non-stoichiometric vapor constituent at the crystal growth interface.

16. An apparatus for the growth of bulk single crystals of AlN at enhanced growth rates by depositing species of Al from a liquid Al source and N from an $N_2$ gas source on the growth surface of a seed crystal, said apparatus comprising:

a furnace chamber;

a first crucible area within the furnace chamber, said first crucible area containing a thermal sink and a seed holder holding a seed crystal with the seed crystal in heat transfer relationship to the thermal sink;

a heater for maintaining a desired thermal gradient within the first crucible area;

means for introducing $N_2$ gas into the first crucible area;

means for introducing Al vapor into the first crucible area, said means for introducing Al vapor comprising a second crucible area in fluid communication with the first crucible area and containing liquid Al; and a heater associated with the second crucible area for maintaining the temperature of the liquid Al.

17. The apparatus of claim 16 wherein the liquid Al is at a temperature in the range from about 1000° C. to about 2400° C.

18. The apparatus of claim 16 wherein the liquid Al is at a temperature below about 2200° C.

19. The apparatus of claim 16 including a baffle plate with a central opening, said baffle plate being located between the liquid Al and the seed to create a pressure gradient thereacross and a velocity increase to the Al vapor moving toward the seed, thereby reducing the back diffusion of $N_2$ toward the liquid Al.

20. The apparatus of claim 16 including an effusion system for sweeping away impurities at the crystal growth interface.

21. The apparatus of claim 19 including an effusion system for sweeping away impurities at the crystal growth interface.

* * * * *